United States Patent
Chatwin (10) Patent No.: US 8,274,335 B1
(45) Date of Patent: Sep. 25, 2012

(54) SYSTEM AND METHOD FOR EFFECTIVELY IMPLEMENTING A FRONT END CORE

(75) Inventor: Jeremy Chatwin, Santa Cruz, CA (US)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/066,412

(22) Filed: Apr. 14, 2011

Related U.S. Application Data (63) Continuation-in-part of application No. 13/065,723, filed on Mar. 29, 2011.

(51) Int. Cl.
*H03F 3/08* (2006.01)
(52) U.S. Cl. .......................................... 330/308; 330/98
(58) Field of Classification Search ............... 330/98, 330/150, 308, 310
See application file for complete search history.

(56) References Cited

U.S. PATENT DOCUMENTS

| | | | |
|---|---|---|---|
| 5,892,540 A | 4/1999 | Kozlowski et al. | |
| 6,246,282 B1* | 6/2001 | Oono et al. | 330/86 |
| 6,720,826 B2 | 4/2004 | Yoon | |
| 6,909,082 B2* | 6/2005 | Doh et al. | 250/214 AG |
| 7,562,581 B2 | 7/2009 | Garverick et al. | |
| 2002/0153949 A1 | 10/2002 | Yoon | |
| 2003/0197563 A1* | 10/2003 | Nishizono | 330/308 |
| 2006/0290432 A1* | 12/2006 | Chang et al. | 330/308 |

FOREIGN PATENT DOCUMENTS

GB 2424138 A 9/2006

OTHER PUBLICATIONS

Raut, R., Ghasemi, O., A Power Efficient Wide Band Trans-Impedance Amplifier in Sub-Micron CMOS Integrated Circuit Technology, Dept. of Electr. & Comput. Eng., Concordia Univ., Montereal, QC, http://ieeexplore.ieee.org/Xplore/login.jsp?reload=true&url=http:%3A%2F%2Fieeexplore.ieee.org%2Fiel5%2F4600187%2F4606305%2F04606334.pdf%3Farnumber%3D4606334&authDecision=-203, Aug. 22, 2008, 1 page.

Kromer, C., Sialm, G., Morf, T., Schmatz, M.L., Ellinger, F., Erni, D., Jackel,H., A Low-POwer 20GHz 52-dB Transimpedance Amplifier in 80-nm CMOS, http://ieeexplore.ieee.org/Xplore/login.jsp?url=http%3A%2F%2Fieeexplore.ieee.org%2Fiel5%2F4%2F28938%2F01302265.pdf%3Farnumber%3D1302265&authDecision=-203, Volue:39 Issue:6, Jun. 1, 2004, 1 page.

* cited by examiner

*Primary Examiner* — Henry Choe
(74) *Attorney, Agent, or Firm* — Gregory J. Koerner; Redwood Patent Law (57) ABSTRACT

An apparatus for implementing a front end core for a transimpedance amplifier includes an input transimpedance stage that receives an FE core input signal and responsively generates an output transimpedance gain signal. A first output gain stage receives the output transimpedance gain signal and responsively generates an FE core output signal. A phase inverter stage also receives the output transimpedance gain signal and responsively generates an inverted output signal. A second output gain stage then receives the inverted output signal and responsively generates an inverted FE core output signal.

20 Claims, 9 Drawing Sheets

SYSTEM AND METHOD FOR EFFECTIVELY IMPLEMENTING A FRONT END CORE

CROSS-REFERENCE TO RELATED APPLICATIONS

This application is a continuation-in-part of, and claims priority in, U.S. patent application Ser. No. 13/065,723 entitled "System And Method For Effectively Implementing A Unit Gm Cell" that was filed on Mar. 29, 2011. The foregoing related application is commonly assigned, and is hereby incorporated by reference.

BACKGROUND SECTION

1. Field of the Invention

This invention relates generally to techniques for transferring electronic information, and relates more particularly to a system and method for effectively implementing a front end core.

2. Description of the Background Art

Implementing effective methods for transferring electronic information is a significant consideration for designers and manufacturers of contemporary electronic systems. However, effectively implementing data transfer systems may create substantial challenges for system designers. For example, enhanced demands for increased system functionality and performance may require additional hardware resources. An increase in hardware requirements may also result in a corresponding detrimental economic impact due to increased production costs and operational inefficiencies.

Furthermore, enhanced system capability to perform various advanced transfer operations may provide additional benefits to a system user, but may also place increased demands on the control and management of various system components. For example, an enhanced electronic system that effectively transfers digital image data may benefit from an effective implementation because of the large amount and complexity of the digital data involved.

Due to growing demands on system resources and substantially increasing data magnitudes, it is apparent that developing new techniques for implementing and utilizing data transfer systems is a matter of concern for related electronic technologies. Therefore, for all the foregoing reasons, developing effective systems for transferring electronic information remains a significant consideration for designers, manufacturers, and users of contemporary electronic systems.

SUMMARY

In accordance with the present invention, a system and method are disclosed for effectively implementing a front end core for a transimpedance amplifier. The front end core provides broad-band, low-noise signal amplification, and also provides conversion from a single-ended input signal to a balanced or differential output signal. In accordance with one embodiment, the front end core includes an input transimpedance stage, a phase inverter stage, and a pair of identical output voltage-gain stages. All stages typically comprise multiples of a unit Gm cell.

In certain embodiments, the transimpedance input stage comprises a transimpedance gain device and a feedback resistor that receive input current and provide a transimpedance stage output voltage and some gain. The phase inverter stage comprises an inverter device and an inverter feedback device that are connected in a back-to-back configuration to generate an inverted output signal at unity gain. The pair of identical output voltage-gain stages each comprise an output gain device with a corresponding feedback resistor.

In one embodiment, the front end core receives an FE core input signal at the transimpedance gain device and responsively generates an output transimpedance gain signal that is provided to both a gain stage input of a first voltage-gain device and to an inverter input of the inverter device. The first voltage-gain device responsively generates an FE core output signal to downstream devices. The inverter device generates an inverted output signal at unity gain that is provided to a gain stage input of a second voltage-gain device. In certain embodiments, the inverter feedback device lowers the output impedance of the transimpedance gain stage, and therefore functions as a bandwidth enhancer. The second voltage-gain device generates an inverted FE core output signal to downstream devices. For at least the foregoing reasons, the present invention therefore provides an improved system and method for effectively implementing a front end core for a transimpedance amplifier.

DETAILED DESCRIPTION

The present invention relates to an improvement in data transmission systems. The following description is presented to enable one of ordinary skill in the art to make and use the invention, and is provided in the context of a patent application and its requirements. Various modifications to the disclosed embodiments will be readily apparent to those skilled in the art, and the generic principles herein may be applied to other embodiments. Thus, the present invention is not intended to be limited to the embodiments shown, but is to be accorded the widest scope consistent with the principles and features described herein.

The present invention is described herein as an apparatus for implementing a front end core for a transimpedance amplifier, and includes an input transimpedance stage, a phase inverter stage, and a pair of output voltage gain stages. The input transimpedance stage receives an FE core input signal and responsively generates an output transimpedance gain signal. A first output gain stage receives the output transimpedance gain signal and responsively generates an FE core output signal. The phase inverter stage also receives the output transimpedance gain signal and responsively generates an inverted output signal. A second output gain stage then receives the inverted output signal and responsively generates an inverted FE core output signal.

Figure 1:
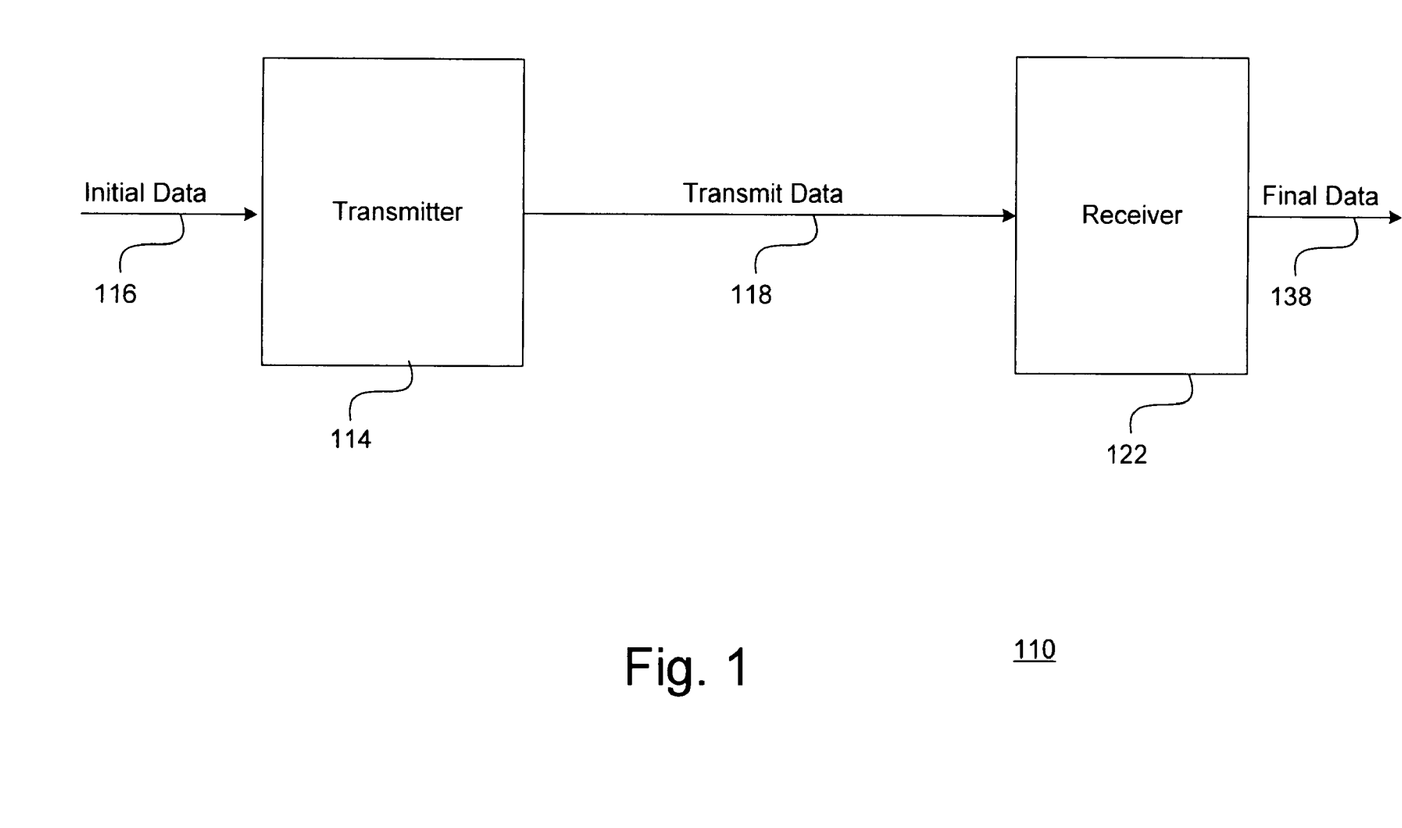
FIG. 1 is a block diagram of a data transmission system, in accordance with one embodiment of the present invention.

Referring now to FIG. 1, a block diagram of a data transmission system 110 is shown, in accordance with one embodiment of the present invention. In the FIG. 1 embodiment, data transmission system 110 includes, but is not limited to, a transmitter 114 and a receiver 122. In alternate embodiments, data transmission system 110 may be implemented using components and configurations in addition to, or instead of, certain of those components and configurations discussed in conjunction with the FIG. 1 embodiment.

In the FIG. 1 embodiment of data transmission system 110, a transmitter 114 receives initial data 116 from any appropriate data source. The transmitter 114 then sends the initial data 116 over any appropriate type of transmission channel as transmit data 118. A receiver 122 of data transmission system 110 may then receive and process the transmit data 118 to thereby provide final data 138 to any appropriate data destination.

Data transmission system 110 may thus transfer any desired type of electronic data or information between two separate locations via a transmission channel. These locations may be considerably distant (for example, between continents or between satellites), or may alternately be relatively close to each other (for example, between devices inside electronic equipment). A wide range of physical transmission media may be used to facilitate this transmission. Examples include electro-magnetic waves in free space (wireless transmission), or electro-magnetic waves in a constrained media (optical fiber, waveguides, cables, etc.).

In the FIG. 1 embodiment, data transmission system 110 thus transfers data from a transmitter (TX) 114 to a receiver (RX) 122 across a channel. In embodiments where data transmission system 110 is implemented as an optical data transmission system, a TX 114 launches a light wave, modulated with data, across a channel. The RX 122 receives the modulated light wave from the other end of the channel and converts the modulation back to data. The channel may be constrained (transmission across an optical fiber) or unconstrained (transmission through free space).

Typically, the TX 114 may include a serializer, a clock synthesizer, a method for adding pre-emphasis, a driver and an electrical to optical transducer. The serializer converts incoming low rate parallel words to high rate serial transmission symbols. The clock synthesizer generates the high rate clock used to transmit the serial transmission symbols. Pre-emphasis may be used to electrically format the serial transmission symbols to pre-compensate anticipated losses in the channel. The driver is used to interface to the electrical to optical transducer. The electrical to optical transducer may include a laser diode or VCSEL device that converts the electrical serial transmission symbols to modulated light. Additional details regarding the implementation and utilization of receiver 122 are further discussed below in conjunction with FIGS. 2-6.

Figure 2:
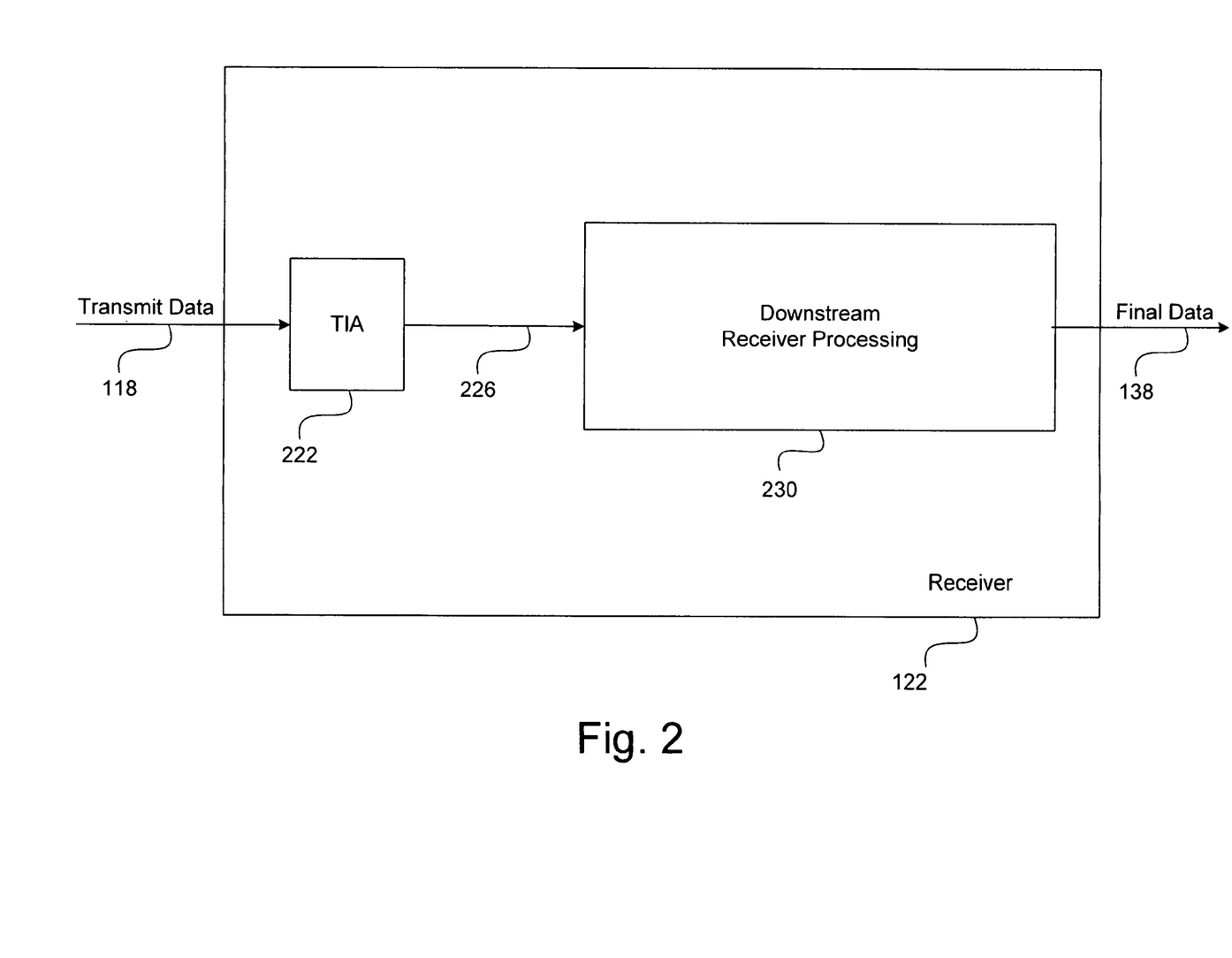
FIG. 2 is a block diagram for one embodiment of the receiver of FIG. 1, in accordance with the present invention.

Referring now to FIG. 2, a block diagram for one embodiment of the FIG. 1 receiver (RX) 122 is shown, in accordance with the present invention. In the FIG. 2 embodiment, receiver 122 may include, but is not limited to, a transimpedance amplifier (TIA) 222 and downstream receiver processing 230. In alternate embodiments, receiver 122 may be implemented using components and configurations in addition to, or instead of, certain of those components and configurations discussed in conjunction with the FIG. 2 embodiment. In various embodiments, receiver 122 may be implemented as any other appropriate type of electronic device.

In the FIG. 2 embodiment, transmit data 118 may be received from any desired data source, and may be encoded in any appropriate data format. For example, in certain embodiments, transmit data 118 may be received from a transmitter 114 of a data transmission system 110 (FIG. 1). In the FIG. 2 embodiment, the RX 122 may typically include an optical to electrical transducer (see FIG. 3), a transimpedance amplifier (TIA) 222, and downstream receiver processing 230 that includes, but is not limited to, a limiting amplifier (LA) or automatic gain control amplifier (AGC), an equalizer (EQ), a clock and data recovery unit (CDR) and a deserializer. The optical to electrical transducer is typical a photo diode (PD) or PIN diode which converts incoming modulated light to a low amplitude electrical signal.

A transimpedance amplifier (TIA) 222 is an integral component in an optical data transmission system. The TIA 222 amplifies the low amplitude electrical signal and produces a differential output voltage. The LA or AGC further amplifies the TIA output to a level suitable for further processing. An EQ may be used to compensate for signal distortions introduced by the channel and/or the transducers. The CDR synchronizes the incoming signal to a local clock and makes decisions as to the most likely transmitted data. The deserializer converts the received high rate serial data to a lower rate parallel word stream. Certain additional details for the implementation and utilization of TIA 222 are further discussed below in conjunction with FIGS. 3-6.

Figure 3:
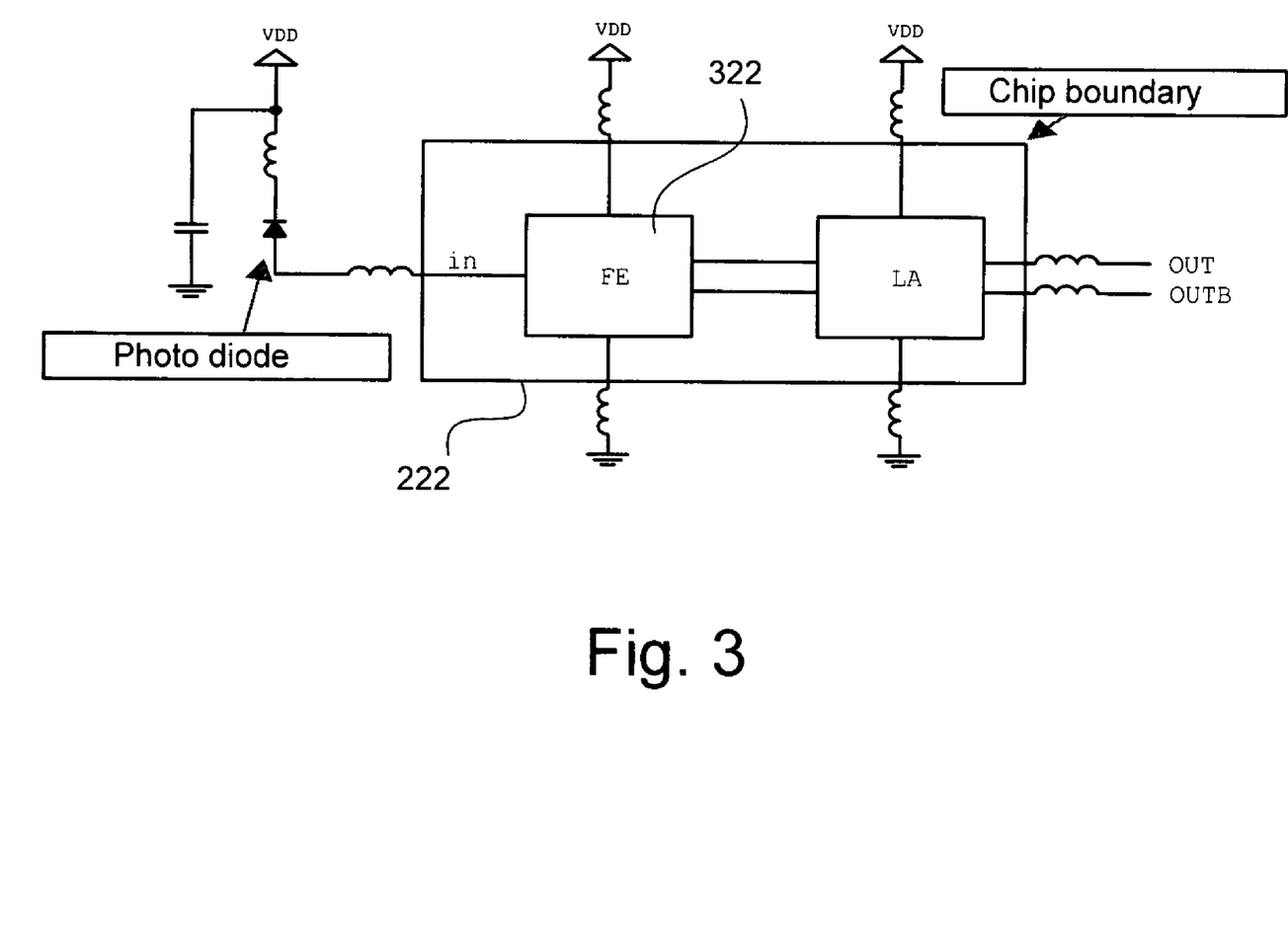
FIG. 3 is a block diagram for the transimpedance amplifier of FIG. 2, in accordance with one embodiment of the present invention.

Referring now to FIG. 3, a block diagram for the FIG. 2 TIA 222 is shown, in accordance with one embodiment of the present invention. The FIG. 3 diagram is presented for purposes of illustration, and in alternate embodiments, TIAs 222 may utilize components and configurations in addition to, or instead of, certain of those components and configurations discussed in conjunction with the FIG. 3 embodiment.

In the FIG. 3 embodiment, an optical to electrical transducer is typically a photo diode (PD) or PIN diode which converts incoming modulated light to a low amplitude electrical signal that is processed by a front end (FE) 322 which amplifies the low amplitude electrical signal and produces a differential output voltage. The LA or AGC further amplifies the FE output to a level suitable for further processing.

In the FIG. 3 embodiment, TIA 222 is typically a single chip comprising front end (FE) 322, which performs low noise amplification, DC cancellation and single ended to balanced conversion, and an additional buffer or amplifier (LA) to drive an output signal off chip. The TIA 222 may also contain additional devices to assist in biasing an optical to electrical transducer and to perform other ancillary tasks. In the FIG. 3 embodiment, FE 322 may include one or more unit Gm cells that function as transductors or gain cells. Unit Gm cells characteristically have a transconductance parameter referred to as "Gm" which refers to the ratio of the incremental change in output current to the incremental change in input voltage. Additional details for the implementation and utilization of front end 322 are further discussed below in conjunction with FIGS. 4-6.

Figure 4A:
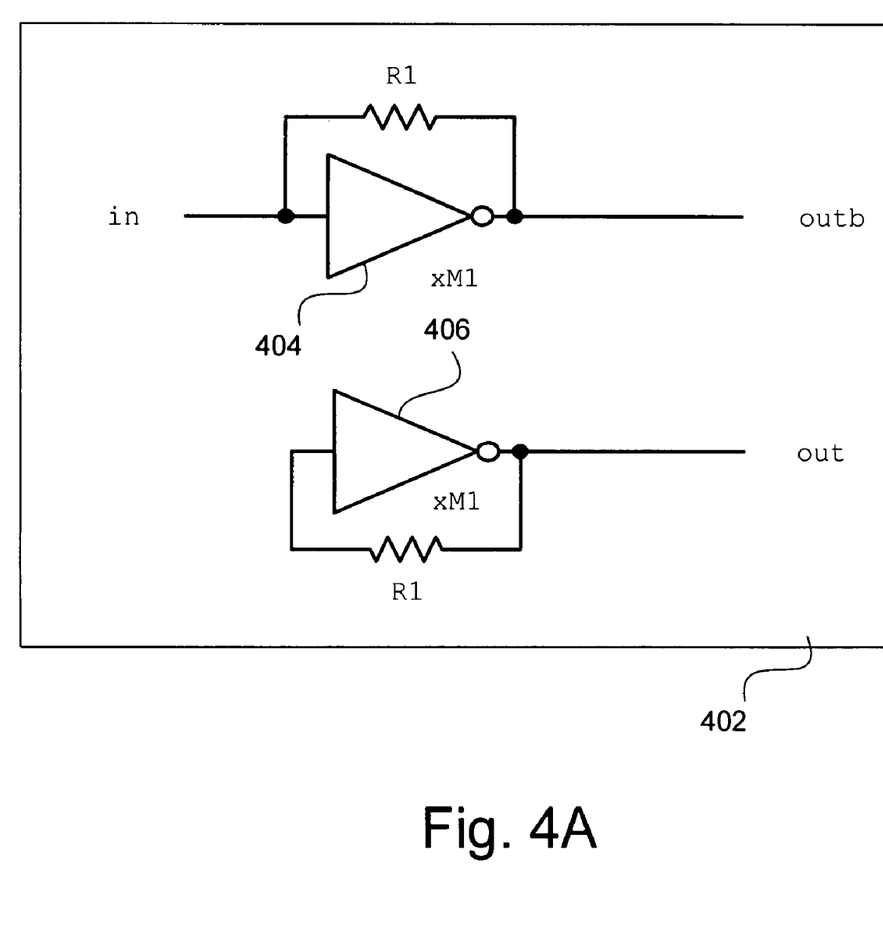
FIG. 4A is a schematic diagram for a conventional front end core.

Referring now to FIG. 4A, a block diagram for a conventional front end (FE) core 402 is shown, in accordance with one embodiment of the present invention. The FIG. 4A diagram is presented for purposes of illustration, and in alternate embodiments, front end cores 402 may utilize components and configurations in addition to, or instead of, certain of those components and configurations discussed in conjunction with the FIG. 4A embodiment. In general, FE cores provide broad-band, low-noise signal amplification. Additionally they provide conversion from a single ended input signal to a balanced or differential output signal. Succeeding stages typically require a differential or pseudo-differential input signal. Conventional FE cores typically use one of two general methods to provide this single-ended to balanced conversion. Both methods employ a "dummy" or "replica" of the main input stage.

In the FIG. 4A embodiment, input signal (in) is connected to a single ended amplifier 404 connected between pins "in" and output "outb". A replica 406 of the same type of amplifier, with no connection to its input, is connected to the pin "out". Therefore the "out" voltage approximately tracks the voltage on "outb" over process, supply voltage and temperature (PVT) changes. The output voltage is "pseudo differential" in that "outb" voltage changes in response to changes at "in," whereas the "out" voltage does not change in response to changes at "in".

Other conventional circuits use a truly differential input stage with differential feedback to generate the output reference. In this case both "out" and "outb" voltages change in response to changes at "in". However a replica feedback resistor is still required from "out" to complete the FEcore stage. The utilization of a dummy stage, as discussed in conjunction with the FIG. 4A embodiment, typically utilizes power and also generates a lot of noise which are significant negative aspects of these replica-based embodiments. Certain effective architectures for remedying this problem are discussed below in conjunction with FIGS. 4B-6.

Figure 4B:
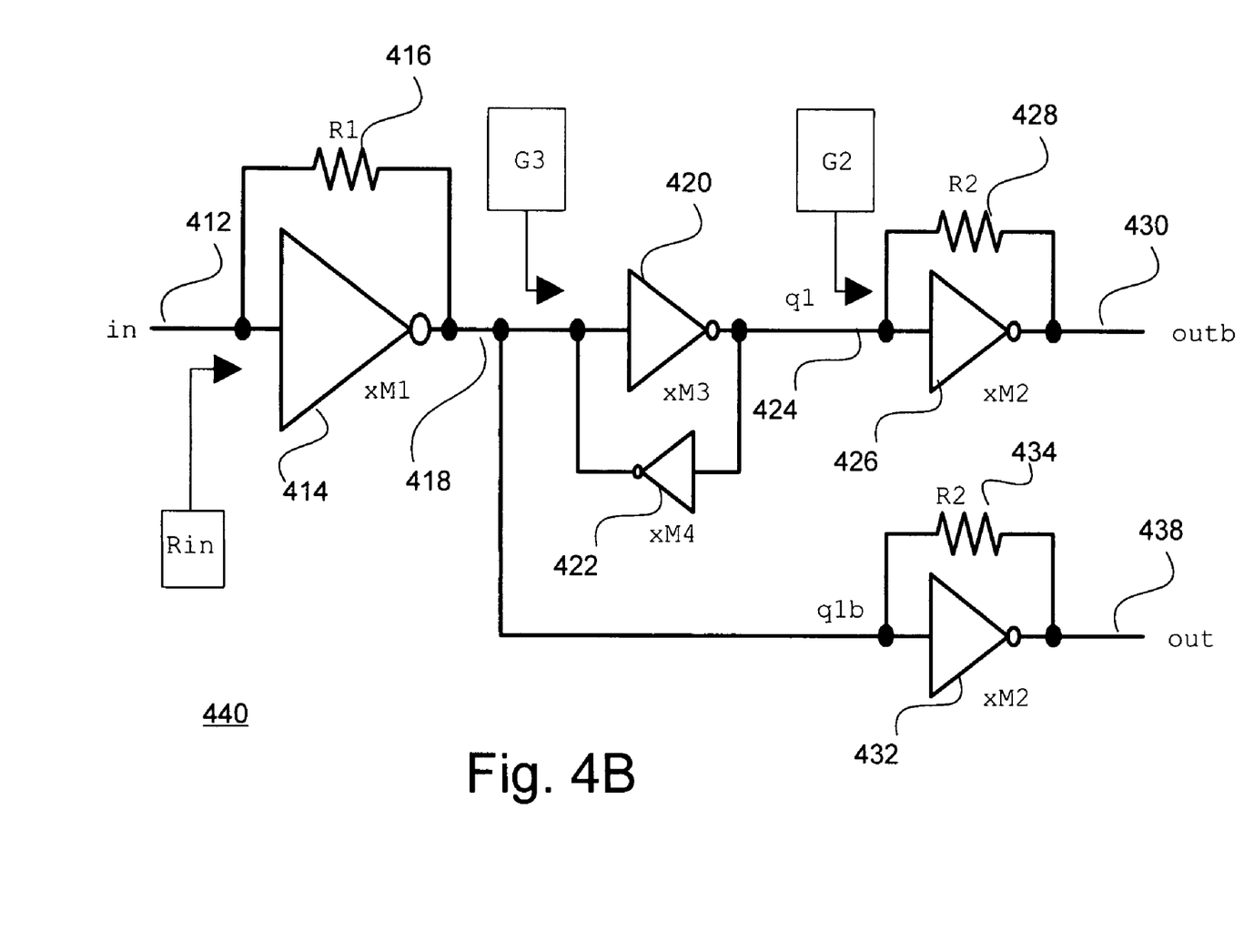
FIG. 4B is a schematic diagram for a first embodiment of a front end core, in accordance with the present invention.

Referring now to FIG. 4B a schematic diagram for a first embodiment of a front end (FE) core 440 is shown, in accordance with the present invention. The FIG. 4B diagram is presented for purposes of illustration, and in alternate embodiments, front end core 440 may utilize components and configurations in addition to, or instead of, certain of those components and configurations discussed in conjunction with the FIG. 4B embodiment.

In the FIG. 4B embodiment, FE core 440 can be split into three sections: 1). A transimpedance input stage, 2). A phase inverter stage, and 3). A pair of identical voltage gain stages. All stages comprise multiples of a unit Gm cell. The particular multiple defining the number of Gm cells is specified by the parameters M1, M2, M3 and M4 in FIG. 4B. Any effective type of Gm cell may be utilized, including but not limited to, the unit Gm cells disclosed below in conjunction with FIGS. 5A, 5B, and 5C.

In the FIG. 4B embodiment, the transimpedance input stage comprises transimpedance gain stage 414 (xM1) and feedback resistor R1 416 that receive input current and provide an output voltage and some gain. The phase inverter stage comprises inverter gain stage 420 (xM3) and inverter feedback gain stage 422 (xM4) that are connected in a back-to-back configuration to generate an inverted output at unity gain. The pair of identical voltage gain stages comprise gain stage 426 (xM2) with feedback resistor R2 428, and gain stage 432 (xM2) with feedback resistor R2 434.

In the FIG. 4B embodiment, FE core 440 receives an input signal (in) 412 at transimpedance gain stage 414 and responsively generates a transimpedance gain stage output 418 that is provided to both an input of voltage gain stage 432 and to an input of phase inverter gain stage 420. Voltage gain stage 432 responsively generates an FE core output signal (out) 438. Phase inverter gain stage 420 generates an inverted output signal 424 at unity gain that is provided to an input of voltage gain stage 426 which then generates an inverted FE core output signal (outb) 430. In the FIG. 4B embodiment, inverter feedback gain stage 422 lowers the output impedance of transimpedance gain stage 414, and therefore functions as a bandwidth enhancer.

In certain embodiments, the input impedance of the voltage gain stages load the input transimpedance stage and the phase inverter stage while the input impedance of the phase inverter stage also loads the input transimpedance stage. Therefore to achieve the desired stage characteristics a particular design method may be utilized to effectively size the Gm cell components in the various gain stages. For purposes of illustration, a series of generalized design steps for designing component values for FE core 440 are shown below. However, other steps, sequences, and techniques may alternately be utilized.

One embodiment of the foregoing design method may include the following steps:

1. Choose initial values for stage 414 (M2) and stage 420 (M3). In general the voltage gain stage requires a voltage gain >1 to minimize its noise contribution. Typically M2>M3.
2. Compute the value of R2 428 that achieves the required phase inverter gain, A3=−1.0:

$$R_2 = \frac{-A_3}{M_3 G_{ds}} \frac{(G_m + G_{ds})}{(G_m + A_3 G_{ds})} - \frac{1}{M_2 G_{ds}}$$

3. Compute input conductance, G2 (shown in FIG. 4B), and voltage gain, A2, for the voltage gain stages:

$$G_2 = \frac{M_2(G_m + G_{ds})}{1 | M_2 G_{ds} R_2}$$

$$A_2 = \frac{1 - M_2 G_m R_2}{1 + M_2 G_{ds} R_2}$$

4. Choose an initial value for gain stage 422 (M4). This gain stage provides positive feedback to the load of the input stage and so helps to extend bandwidth of the input stage.
5. Compute input conductance, G3 (shown in FIG. 4B), of the phase inverter stage:

$$G_3 = M_4 G_m \left[ \frac{G_{ds}}{G_m} - \frac{M_3 G_m}{G_2 \div M_2 G_{ds}} \right]$$

6). Choose an initial value of gain stage 414 (M1).
7. Compute the required R1 416 that achieves the desired input resistance, Rin (shown in FIG. 4B):

$$R_1 = \frac{P_{in}[M_1(G_m + G_{ds}) + G_2 \div G_0] - 1}{M_1 G_{ds} + G_2 + G_2}$$

8. Simulate to determine noise and bandwidth.
9. Iterate values of M1, M2, M3 and M4 until desired performance is achieved.

The total power consumption is proportional to the total number of unit Gm cells, Mtotal, such that:

$$M_{total} = M_1 + M_2 + M_4 + 2M_2$$

Therefore, a set of FEcore designs can be derived that exhibit a fixed total power budget, Mtotal, and required input impedance, Rin. The FIG. 4B transimpedance input stage provides low noise signal amplification, similar to conventional FE cores, but has no replica. The power used for the replica in FIG. 4A may now be employed in the remaining two stages of FIG. 4B. The phase inverter stage provides voltage gain of −1V/V from "q1b" to "q1" of FIG. 4B. Therefore a balanced signal, with both sides responsive to changes at "in" exists at "q1" and "q1b". The voltage gain stages provide simple voltage gain and buffering to drive the succeeding stages.

The FE core 440 of FIG. 4B achieves single-ended to balanced conversion without the use of a replica circuit shown in FIG. 4A, and produces a truly balanced output signal for the succeeding stages. The absence of a replica stage provides an FEcore that consumes the same power and has the same bandwidth of conventional architectures while achieving a lower input referred noise density. Additional details for the implementation and utilization of front end cores 440 are further discussed below in conjunction with FIGS. 4-6.

Figure 5A:
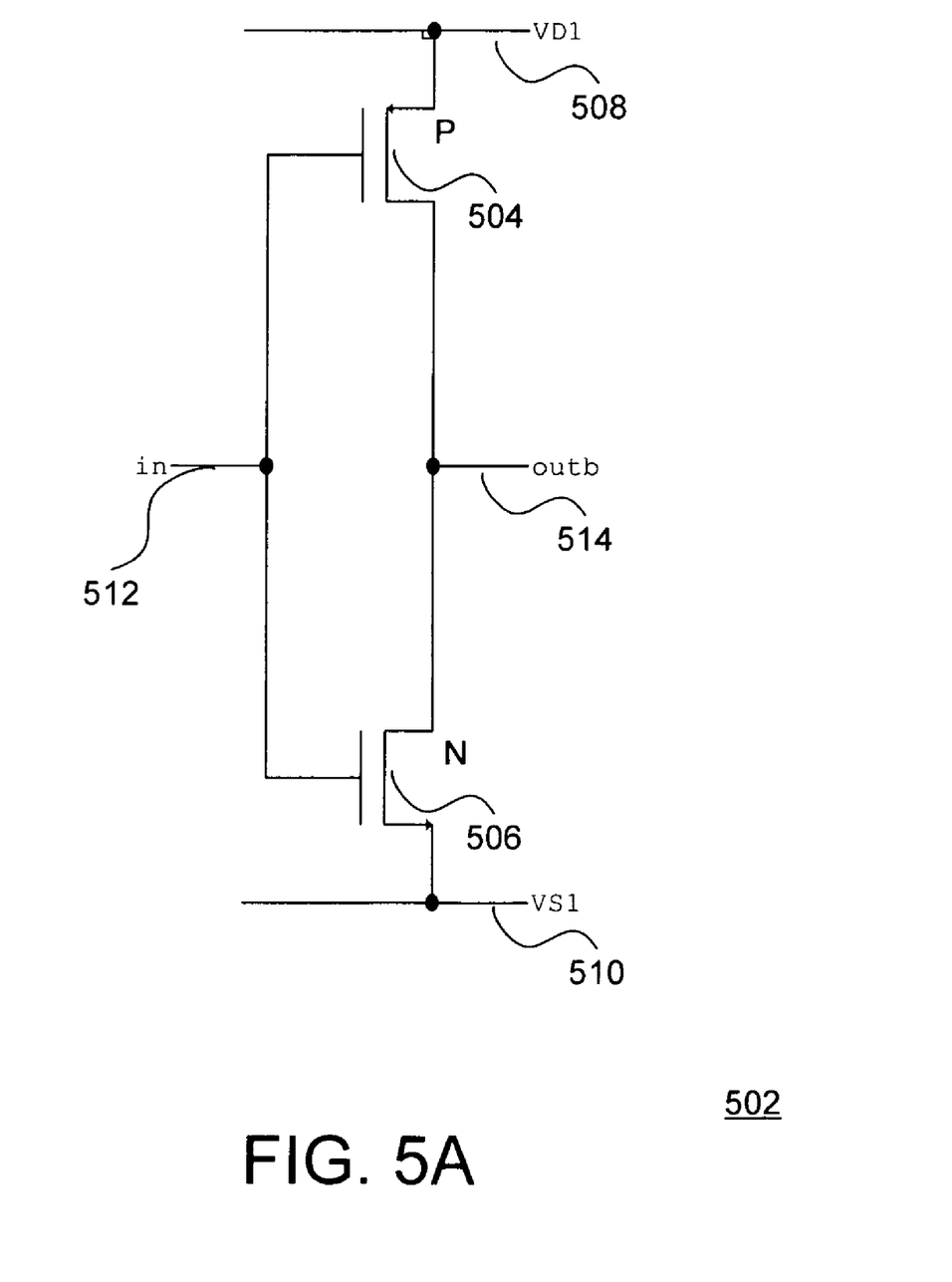
FIG. 5A is a schematic diagram for a first embodiment of a unit Gm cell.
Figure 5B:
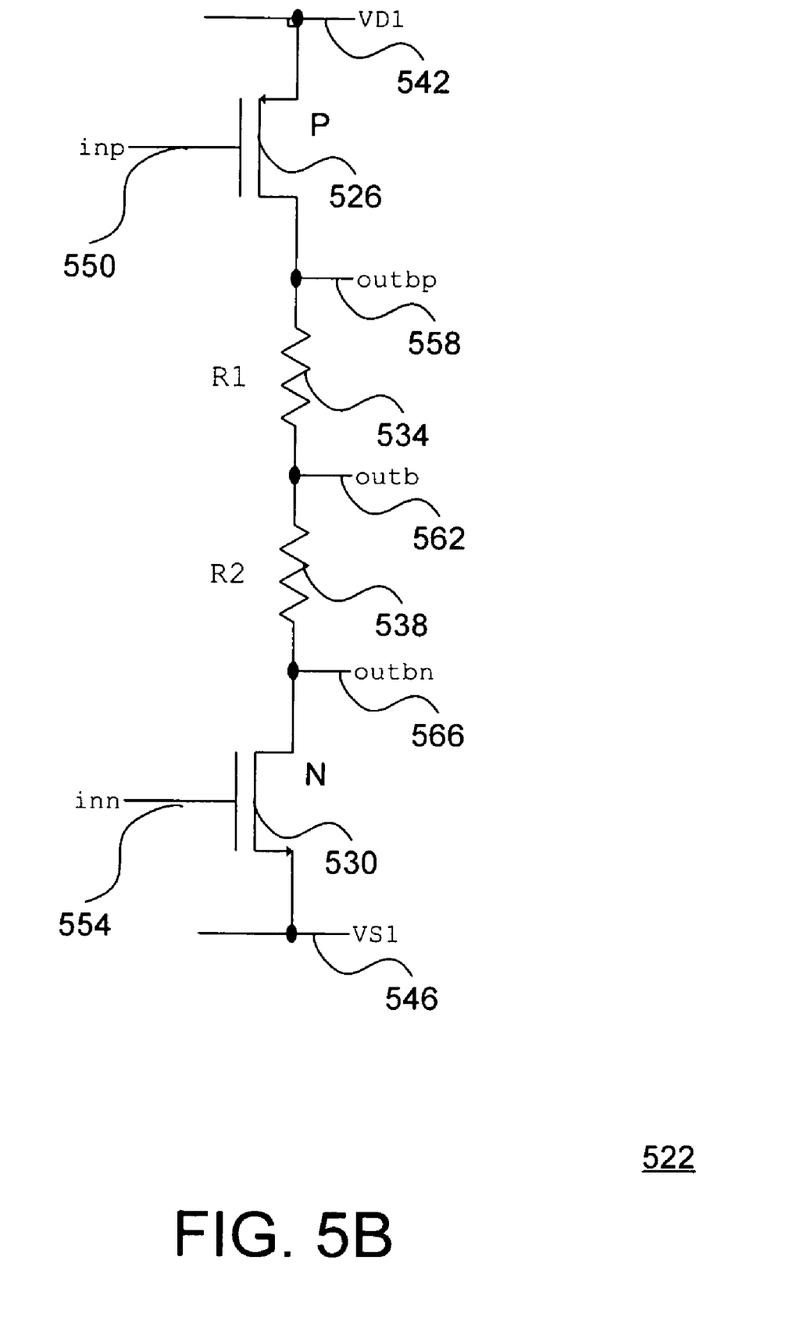
FIG. 5B is a schematic diagram for a second embodiment of a unit Gm cell.
Figure 5C:
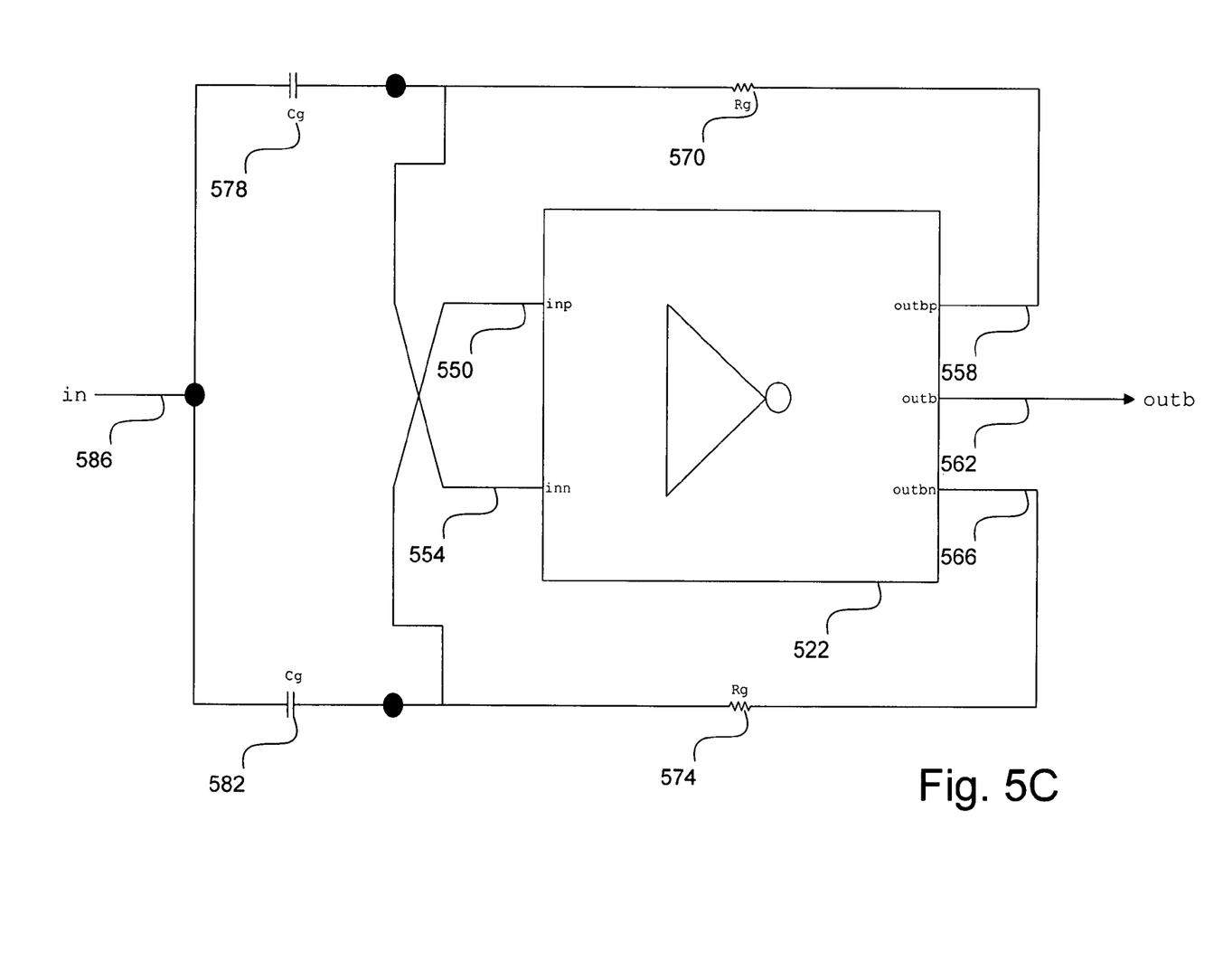
FIG. 5C is a schematic diagram illustrating an electronic circuit for biasing the unit Gm cell of FIG. 5B.

Referring now to FIGS. 5A, 5B, and 5C, schematic diagrams for implementing and biasing of a unit Gm cell are shown, in accordance with one embodiment of the present invention. In alternate embodiments, unit Gm cells may be implemented using components and configurations in addition to, or instead of, certain of those components and configurations discussed in conjunction with the FIG. 5 embodiments.

In the FIG. 5A embodiment, a conventional unit Gm cell 502 based on a simple CMOS inverter is shown. A fixed supply voltage, Vcore (VD1 508), biases the cell 502 and a voltage VS1 510 is typically at ground potential. In typical configurations, a feedback resistor (not shown) is connected from output signal outb 514 to input signal in 512 to effect an FE input stage for TIA 222 (FIG. 2). Therefore, the gate and drain voltages are at substantially the same potential and so the PMOS and NMOS transistors (transistor P 504 and transistor N 506) form a potential divider and both share the same drain current.

Furthermore, typical voltage amplitudes at the gate and drain are in the tens of mV range. Therefore drain voltage excursions have a wide margin of drain-source voltage, VDS, before the onset of triode mode. This wide margin is due to the "stacking" nature of the NMOS and PMOS Vgs. In other words, for the FIG. 5A Gm cell 502, the supply voltage, Vcore (here VD1 508), may be expressed by the formula:

$$Vcore = -Vgs,P + Vgs,N$$

where $-Vgs,P$ is the voltage across transistor P 504 and $Vgs,N$ is the voltage across transistor N 506. The supply voltage for the FIG. 5A embodiment is therefore the sum of the voltages across transistor P 504 and transistor N 506.

In the FIG. 5B embodiment, Gm cell 522 includes an upper-rail supply voltage (VD1 542) which provides a Vcore supply voltage to power Gm cell 522. Gm cell 522 also includes a lower-rail voltage VS1 546 that is typically at or near a ground potential of zero volts. In the FIG. 5B embodiment, the gate of a P-channel transistor P 526 receives an input signal inp 550. The source of transistor P 526 is connected to supply voltage VD1 542, and the drain of transistor P 526 is connected to a first end of a first level-shifting resistor R1 534. An output signal outbp 558 is generated at the junction of the drain of transistor P 526 and the first end of level-shifting resistor R1 534.

In the FIG. 5B embodiment, the gate of an N-channel transistor N 530 receives an input signal inn 554. The source of transistor N 530 is connected to voltage VS1 546, and the drain of transistor N 530 is connected to a second end of a second level-shifting resistor R2 538. An output signal outbn 566 is generated at the junction of the drain of transistor N 530 and the second end of level-shifting resistor R2 538. In the FIG. 5B embodiment, a second end of level-shifting resistor R1 534 is connected to a first end of level-shifting resistor R2 538. A main output signal outb 562 is generated at the junction of the second end of level-shifting resistor R1 534 and the first end of level-shifting resistor R2 538.

In the FIG. 5C embodiment, a biasing circuit is shown for effectively implementing the unit Gm cell 522 of FIG. 5B. In the FIG. 5C embodiment, many of the numbered components refer back to similarly-numbered components shown in FIG. 5B. In the FIG. 5C embodiment, a main input signal 586 is provided through a first coupling capacitor Cg 578 to an input inn 554 of the Gm cell 522. Similarly, the main input signal 586 is provided through a second coupling capacitor Cg 582 to the input inp 550 of the Gm cell 522.

In the FIG. 5C embodiment, the output outbp 558 of Gm cell 522 is returned as a bias voltage through a first bias resistor Rg 570 to the input inn 554 of Gm cell 522. Similarly, the output outbn 566 of Gm cell 522 is returned as a bias voltage through a second bias resistor Rg 574 to the input inp 550 of Gm cell 522. In accordance with the present invention, the biasing configuration shown in FIG. 5C for Gm cell 522 advantageously reduces the required Vcore (VD1 542 of FIG. 5B) for a given Icore, and hence a given Gm, by adding level-shifting resistor R1 534 and level-shifting resistor R2 538 (FIG. 5B). This significant reduction in the required supply voltage VD1 542 provides substantial conservation of power resources for any electronic device that employs unit Gm cell 522.

In the FIGS. 5B and 5C embodiments, the input gates ("inn" and "inp") of NMOS transistor 530 and PMOS transistor 526 are connected to the drains ("outbp" and "outbn") of NMOS transistor 530 and PMOS transistor 526, respectively, through the large bias resistors Rg (570 and 574) that carry zero DC current. Signal current is coupled by the AC coupling capacitors Cg (578 and 582). In certain embodiments, exemplary component values may approximately be: Icore=440 uA, R1=R2=250 ohm, Rg=1 Mohm, Cg=1.6 pF.

Thus, when biased with a constant current of Icore, both the NMOS and PMOS devices will have the same Vgs and same Gm as in the unit Gm cell 422 shown in FIG. 5A. However the required supply voltage headroom, Vcore, is given by the equation:

$$Vcore = -Vgs,P - Icore \times (R1+R2) + Vgs,N$$

where $-Vgs,P$ is the voltage across transistor P 526, $Vgs,N$ is the voltage across transistor N 530, and $Icore \times (R1+R2)$ is the voltage across level-shifting resistors 534 and 538.

Therefore, provided that the voltage drop $Icore \times (R1+R2)$ does not cause the transistors to enter triode mode, the same effective Gm is achieved but with a lower required voltage supply headroom, Vcore. To support a given constant Gm over process and temperature, the unit Gm cell 522 of FIGS. 5B and 5C thus requires less nominal supply voltage and so less power.

Figure 6:
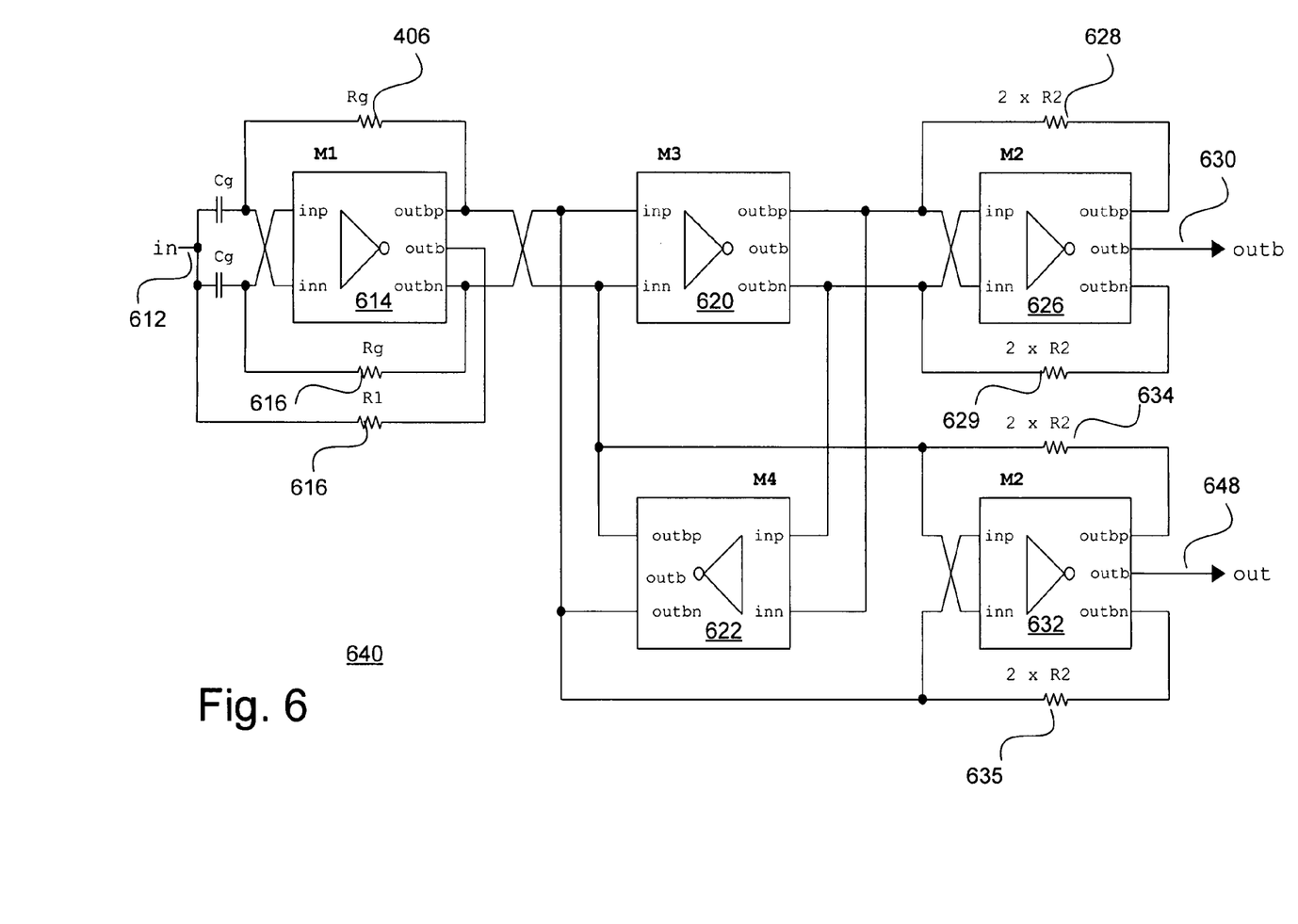
FIG. 6 is a schematic diagram for a second embodiment of a front end core, in accordance with the present invention.

Referring now to FIG. 6, a schematic diagram for a second embodiment of an FE core 640 is shown, in accordance with the present invention. In alternate embodiments, FE core 640 may be implemented using components and configurations in addition to, or instead of, certain of those components and configurations discussed in conjunction with the FIG. 6 embodiment.

In the FIG. 6 embodiment, certain components and signals correspond to analogous components and signals from the FE core 440 of FIG. 4B. For example, in the FIG. 6 embodiment (as in FIG. 4B), FE core 640 can be split into three stages: 1). A transimpedance input stage, 2). A phase inverter stage, and 3). A pair of identical voltage gain stages. All stages comprise multiples of a unit Gm cell. The particular multiple defining the number of Gm cells is specified by the parameters M1, M2, M3 and M4 in FIG. 6. Any effective type of Gm cell may be utilized, including but not limited to, the unit Gm cell disclosed below in conjunction with FIG. 5C.

In the FIG. 6 embodiment, the transimpedance input stage comprises transimpedance gain stage 614 (M1) and feedback resistor R1 616 that receive input current and provide an output voltage and some gain. The phase inverter stage comprises inverter gain stage 620 (M3) and inverter feedback gain stage 622 (M4) that are connected in a back-to-back configuration to generate an inverted output at unity gain. The pair of identical voltage gain stages comprise output gain stage 626 (M2) with feedback resistors R2 628, 629, and output gain stage 632 (M2) with feedback resistors R2 434, 635.

The FE cores of FIGS. 6 and 4B therefore have at least the following similarities: Transimpedance gain stage 614 is analogous to transimpedance gain stage 414, inverter gain stage 620 is analogous to inverter gain stage 420, inverter feedback gain stage 622 is analogous to inverter feedback gain stage 422, output gain stage 626 is analogous to output gain stage 426, and output gain stage 632 is analogous to output gain stage 432. The foregoing discussion of the FIG. 4B FE core 440 is therefore incorporated herein by reference.

However, the FIG. 4B embodiment of FE core 440 may be implemented using unit Gm cells that have a single input "in" and a single output "outb". In the FIG. 6 embodiment, a similar FE core topology, with some modification, may be implemented using the FIG. 5C unit Gm cell and bias circuitry. In the FIG. 6 embodiment, each gain stage has a "p" input and output, and an "n" input and output. For correct biasing, the "p" outputs should connect to "n" inputs and vice versa (as shown in FIG. 5C). In this way, the AC coupling capacitors, Cg, and large value resistors, Rg, are avoided for the gain stages except the input gain stage 614 (M1).

The FIG. 6 embodiment of FE core 640 feeds DC bias voltages from the outputs of gain stage 614 to effectively bias the inputs of all the other gain stages. The level-shifting discussed above in conjunction with the FIG. 5B unit Gm cell is achieved by the initial gain stage 614, so that no further level-shifting is required by the remaining gain stages in FE core 640. For all of the foregoing reasons, the present invention provides an improved system and method for effectively implementing a front end core.

The invention has been explained above with reference to certain embodiments. Other embodiments will be apparent to those skilled in the art in light of this disclosure. For example, the present invention may readily be implemented using configurations and techniques other than those described in the embodiments above. Additionally, the present invention may effectively be used in conjunction with systems other than those described above. Therefore, these and other variations upon the discussed embodiments are intended to be covered by the present invention, which is limited only by the appended claims.

What is claimed is:

1. An apparatus for implementing a front end core, comprising:
    an input transimpedance stage that receives an FE core input signal and responsively generates an output transimpedance gain signal;
    a first output gain stage that receives said output transimpedance gain signal and responsively generates an FE core output signal;
    a phase inverter stage that receives said output transimpedance gain signal and responsively generates an inverted output signal; and
    a second output gain stage that receives said inverted output signal and responsively generates an inverted FE core output signal.

2. The apparatus of claim 1 wherein said front end core is utilized in a transimpedance amplifier of a receiver device.

3. The apparatus of claim 1 wherein said input transimpedance stage includes a transimpedance gain device that receives said FE core input signal and generates said output transimpedance gain signal.

4. The apparatus of claim 3 wherein said transimpedance gain device is implemented with a single unit Gm cell.

5. The apparatus of claim 3 wherein said transimpedance gain device receives a current signal and outputs a voltage signal.

6. The apparatus of claim 3 wherein said input transimpedance stage includes a feedback resistor that is connected between an output and an input of said transimpedance gain device.

7. The apparatus of claim 1 wherein said FE core input signal is generated by a photo diode device.

8. The apparatus of claim 1 wherein said phase inverter stage includes an inverter device that receives said output transimpedance gain signal and generates said inverted output signal.

9. The apparatus of claim 8 wherein said inverter device is implemented with three unit Gm cells.

10. The apparatus of claim 8 wherein said inverter device generates said inverted output signal with unity gain.

11. The apparatus of claim 8 wherein said phase inverter stage includes an inverter feedback device that is connected in a back-to-back configuration between an output and an input of said inverter device.

12. The apparatus of claim 11 wherein said inverter feedback device functions as a bandwidth enhancer.

13. The apparatus of claim 11 wherein said inverter feedback device is implemented with four unit Gm cells.

14. The apparatus of claim 1 wherein said first output gain stage and said second output gain stage each includes an output gain device that provides gain to received input signals.

15. The apparatus of claim 14 wherein said output gain device is implemented with two unit Gm cells.

16. The apparatus of claim 14 wherein a feedback resistor is connected between an output and an input of said output gain device.

17. The apparatus of claim 1 wherein said front end core is implemented with multiples of a unit Gm cell that includes an input P that receives an input P signal and an input N that receives an input N signal, said unit Gm cell further including an output P that generates an output P signal that is connected through a first bias resistor to said input N, said unit Gm cell also including an output N that generates an output N signal that is connected through a second bias resistor to said input P.

18. The apparatus of claim 17 wherein said unit Gm cell includes level-shifting resistors that cause said output P signal and said output N signal to be at different respective voltage levels, a Vcore supply voltage being reduced by a voltage potential across said level-shifting resistors to operate said unit Gm cell with a reduced Vcore supply voltage.

19. The apparatus of claim 1 wherein said front end core is implemented without utilizing a replica circuit of a main input stage of said front end core.

20. A method for implementing a front end core by performing the steps of:
    receiving an FE core input signal with an input transimpedance stage that responsively generates an output transimpedance gain signal;

providing a first output gain stage that receives said output transimpedance gain signal and responsively generates an FE core output signal;

utilizing a phase inverter stage to receive said output transimpedance gain signal and responsively generate an inverted output signal; and receiving said inverted output signal with a second output gain stage that responsively generates an inverted FE core output signal.

\* \* \* \* \*